United States Patent
Szeles et al.

(10) Patent No.: US 8,268,663 B2
(45) Date of Patent: Sep. 18, 2012

(54) ANNEALING OF SEMI-INSULATING CDZNTE CRYSTALS

(75) Inventors: Csaba Szeles, Allison Park, PA (US); Michael Prokesch, Gibsonia, PA (US); Utpal Chakrabarti, Allentown, PA (US)

(73) Assignee: II-VI Incorporated, Saxonburg, PA (US)

( * ) Notice: Subject to any disclaimer, the term of this patent is extended or adjusted under 35 U.S.C. 154(b) by 0 days.

(21) Appl. No.: 12/996,150

(22) PCT Filed: Jun. 2, 2009

(86) PCT No.: PCT/US2009/045933
§ 371 (c)(1),
(2), (4) Date: Feb. 23, 2011

(87) PCT Pub. No.: WO2009/149062
PCT Pub. Date: Dec. 10, 2009

(65) Prior Publication Data
US 2011/0136287 A1 Jun. 9, 2011

Related U.S. Application Data

(60) Provisional application No. 61/059,408, filed on Jun. 6, 2008.

(51) Int. Cl.
*H01L 21/00* (2006.01)
*H01L 21/322* (2006.01)
(52) U.S. Cl. .............. 438/84; 257/E21.212; 136/260
(58) Field of Classification Search .......... 438/57, 438/84, 475; 257/E21.212; 136/260
See application file for complete search history.

(56) References Cited

U.S. PATENT DOCUMENTS

| | | | |
|---|---|---|---|
| 4,374,684 A | 2/1983 | Micklethwaite | |
| 4,845,055 A | 7/1989 | Ogata | |
| 6,137,048 A * | 10/2000 | Wu et al. | 136/260 |
| 6,251,701 B1 | 6/2001 | McCandless | |
| 2003/0209184 A1 | 11/2003 | Kazandjian et al. | |
| 2005/0115489 A1 | 6/2005 | Triboulet et al. | |

OTHER PUBLICATIONS

A. P. Jacob et al., "Hydrogen Passivation of Nitrogen Acceptors Confined in CdZnTe quantum Well Structures", AIP, Journal of Applied Phyics, vol. 90, No. 5, Sep. 1, 2001, pp. 2329-2332.*
Muren Chu et al., "Tellurium Antisites in CdZnTe", AIP, Applied Physics Letters, vol. 79, No. 17, Oct. 22, 2001, pp. 2728-2730.*
Werner Kern, "Handbook of Semiconductor Wafer Cleaning", William Andrew Publishing/Noyes, 1993, pp. 3.*
Szeles, "Advances in the Crystal Growth and Device Fabrication Technology of CdZnTe Room Temperature Radiation Detectors", IEEE Transactions on Nuclear Science, 2004, pp. 1242-1249, vol. 51, No. 3.
Prokesch, "Effect of temperature- and composition-dependent deep level energies on electrical compensation: Experiment and model of the Cd1-xZnxTe system", Physical Review B 75, 2007, pp. 245204/1-245204/7.
Rustom et al., "Low Temperature Thermal Annealing of Detector Grade CdZnTe (CZT) Crystals", University of Surrey, May 1, 2007, pp. i-vii & 1-68, Guildford, Surrey, U.K.

* cited by examiner

*Primary Examiner* — William D Coleman
(74) *Attorney, Agent, or Firm* — The Webb Law Firm

(57) ABSTRACT

In a method of annealing a $Cd_{1-x}Zn_xTe$ sample/wafer, surface contamination is removed from the sample/wafer and the sample/wafer is then introduced into a chamber. The chamber is evacuated and Hydrogen or Deuterium gas is introduced into the evacuated chamber. The sample/wafer is heated to a suitable annealing temperature in the presence of the Hydrogen or Deuterium gas for a predetermined period of time.

5 Claims, 1 Drawing Sheet

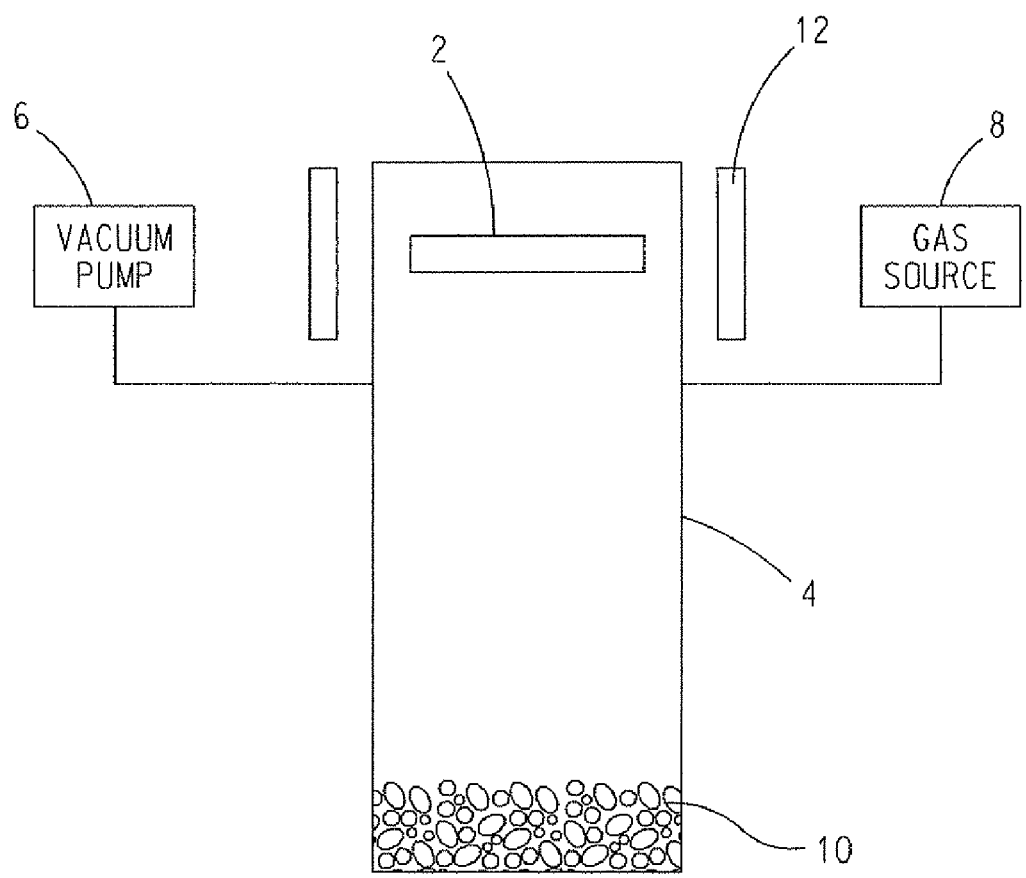

US 8,268,663 B2

ANNEALING OF SEMI-INSULATING CDZNTE CRYSTALS

BACKGROUND

1. Field of the Invention

The present invention relates to $Cd_{1-x}Zn_xTe$ samples/wafers and, more particularly, to a method of annealing $Cd_{1-x}Zn_xTe$ samples/wafers.

2. Description of Related Art

Semi-insulating $Cd_{1-x}Zn_xTe$ crystals with a Zn composition typically in the $0 \leq x \leq 0.25$ mole fraction range are typically used for room-temperature semiconductor x-ray and gamma-ray radiation detector applications. The semi-insulating or high electrical resistivity ($\geq 10^9$ Ωm) state of such $Cd_{1-x}Zn_xTe$ crystals is typically achieved by a deep-level defect compensation technique. While achieving the highly resistive state is straightforward with this technique, it is not trivial and very challenging to keep the concentration of the electrically active compensating deep-level defects sufficiently low to achieve good carrier lifetimes and mobilities.

The product of electron (e) and hole (h) mobilities (μ) and lifetimes (τ) ($\mu_e \tau_e$ and $\mu_h \tau_h$ respectively) are key material parameters controlling the performance of x-ray and gamma-ray detectors fabricated from semi-insulating $Cd_{1-x}Zn_xTe$ crystals. In order to achieve the necessary high electron and hole mobility lifetime products, $Cd_{1-x}Zn_xTe$ ingots and crystals are typically subjected to annealing (heat treatment) in-situ in the growth ampoule (essentially during the cool down of the as-grown ingot) or ex-situ in a post-growth annealing process, typically after the crystals are separated by slicing and dicing. The annealing process either relaxes the defect structure of the crystals or ingots (essentially reduces the concentration of harmful defects) or passivates the electrically active defects (no change in the defect concentration but reduction of the active fraction of the defects).

Notwithstanding the success of current methods of annealing semi-insulating $Cd_{1-x}Zn_xTe$ crystals, it would be beneficial for room-temperature semiconductor x-ray and gamma-ray radiation detector applications to provide semi-insulating $Cd_{1-x}Zn_xTe$ crystals that have even better electron and hole mobility lifetime product.

SUMMARY OF THE INVENTION

The invention is a method of annealing a $Cd_{1-x}Zn_xTe$ sample/wafer comprises (a) removing surface contamination from the sample/wafer; (b) installing the sample/wafer of step (a) into a chamber; (c) following step (b), evacuating the chamber; (d) introducing Hydrogen or Deuterium gas into the evacuated chamber; (e) heating the sample/wafer to a suitable annealing temperature; and (f) maintaining the sample/wafer in the conditions of steps (d) and (e) for a predetermined period of time.

Step (e) can include heating the sample/wafer to a temperature between 400° C.-650° C.

The method can further include, prior to step (c), installing Tellurium in the chamber. Step (e) can further include heating the evacuated chamber whereupon the sample/wafer in the chamber is at a higher temperature than the Tellurium in the chamber.

The sample/wafer can be heated to a temperature between 400° C.-650° C. The Tellurium can be heated to a temperature between 250° C.-550° C.

The predetermined period of time can be between 1 hour and 128 days.

The Zn composition of the $Cd_{1-x}Zn_xTe$ sample/wafer is between $0 \leq x \leq 0.25$ mole fraction.

The method can further include: (g) following step (f), cooling the chamber to room temperature at a rate between 0.01 degree centigrade per minute and 1.0 degree centigrade per minute; (h) following step (g), removing the sample/wafer from the chamber; and (i) fabricating the removed sample/wafer into one or more x-ray and/or gamma-ray radiation detectors.

Between 0.1-1.0 atmosphere of Hydrogen or Deuterium gas can be introduced into the evacuated chamber.

The invention is also a method of annealing a $Cd_{1-x}Zn_xTe$ sample/wafer comprising: (a) exposing the sample/wafer to pressure of $\leq 10^{-5}$ torr of ambient air; (b) following step (a), exposing the sample/wafer to $\leq 1.0$ atmosphere of Hydrogen or Deuterium gas; (c) heating the sample/wafer to an annealing temperature; (d) maintaining the sample/wafer in the conditions of steps (b) and (c) for a predetermined period of time.

Step (c) can include heating the sample/wafer to a temperature between 400° C.-650° C.

The method can further include exposing the sample/wafer to between $2.1 \times 10^{-7}$ and $3.0 \times 10^{-3}$ atmospheres of Tellurium vapors. Step (c) can further include heating the sample/wafer to a temperature greater than a temperature of a source of the Tellurium vapors.

The source of the Tellurium vapors can be heated to a temperature between 250° C. -550° C.

The method can further include: (e) following step (d), cooling the sample/wafer to room temperature at a rate between 0.01 degree centigrade per minute and 1.0 degree centigrade per minute; (f) following step (e), exposing the sample/wafer to ambient air and pressure; and (g) fabricating the removed sample/wafer into one or more x-ray and/or gamma-ray radiation detectors.

The method can further include, prior to step (a), removing surface contamination from the sample/wafer.

The predetermined period of time can be between 1 hour and 128 days.

BRIEF DESCRIPTION OF THE DRAWING

FIG. 1 is a schematic view of an annealing chamber for annealing samples/wafers in accordance with the present invention.

DETAILED DESCRIPTION OF THE INVENTION

Disclosed is an annealing process for semi-insulating $Cd_{1-x}Zn_xTe$ crystals in the presence of Hydrogen ($H_2$) gas; Hydrogen ($H_2$) gas and Tellurium ($Te_2$) vapors; Deuterium ($D_2$) gas; or Deuterium ($D_2$) gas and Tellurium ($Te_2$) vapors that increases the electron mobility-lifetime product of the crystals, typically by a factor of 2×-5×, depending on the process parameters utilized to grow the crystals and the annealing process parameters. This increase in the electron mobility-lifetime product of the crystals results in improvements in both the performance of x-ray and gamma-ray detector devices made from the crystals as well as the fabrication yields of the crystals. The annealing process is not limited by the size or geometry of the devices or the composition (x) of the $Cd_{1-x}Zn_xTe$ crystals.

With reference to FIG. 1, in preparation for annealing, $Cd_{1-x}Zn_xTe$ crystal boules are formed into samples/wafers (slices) 2 of desired size and thickness. Surface contamination is then removed from each sample/wafer 2 by any suitable and/or desirable cleaning technique known in the art, e.g., chemical etching, plasma cleaning, etc. One or more sample(s)/wafer(s) 2 are then placed in an annealing chamber 4, e.g., without limitation, a quartz annealing tube. Chamber 4 is then evacuated via a vacuum pump 6 to a high vacuum, e.g., without limitation, less than $10^{-5}$ ton, to remove atmospheric (ambient) air and its water vapor from the interior of chamber 4. Once evacuated, the interior of chamber 4 is then filled with 0.1-1.0 atm high-purity Hydrogen ($H_2$) gas, or alternatively, with high purity Deuterium ($D_2$) gas from a gas source 8 and sealed vacuum tight. Optionally, prior to chamber 4 being evacuated to a high vacuum, an appropriate size load of high-purity Te 10 is introduced into chamber 4 at a different location than the sample(s)/wafer(s) 2 to enable a temperature difference to be formed between the $Cd_{1-x}Zn_xTe$ sample(s)/wafer(s) 2 and the Te charge. For the purpose of this description, it will be assumed that Te is present in the chamber. However, this is not to be construed as limiting the invention since it is envisioned that annealing of the sample(s)/wafer(s) 2 (described hereinafter) can be accomplished only in the presence of Hydrogen ($H_2$) or Deuterium ($D_2$) gas.

Chamber 4 is then heated via a suitable heating means, such as, without limitation, a resistive heater 12, to desired temperatures whereupon a temperature gradient forms in chamber 4 such that the temperature of the sample(s)/wafer(s) 2, or the annealing temperature ($T_{ann}$), is higher than the temperature of the Te vapor source ($T_{Te}$). The partial pressure of vapors of Te, i.e., $Te_2$, in chamber 4 (when Te is provided in chamber 4) has been observed to be between $2.1 \times 10^{-7}$ atm and $3.0 \times 10^{-3}$ atm. Suitable temperature ranges of $T_{ann}$ and $T_{Te}$ include: $T_{ann}$=400° C.-650° C. and $T_{Te}$=250° C.-550° C. The sample(s)/wafer(s) 2 are annealed under these conditions for a period typically between 1 hour and 128 days depending on the thickness of the sample(s)/wafer(s) 2 to achieve an increase of the electron mobility-lifetime product.

Once annealing of the sample(s)/wafer(s) 2 is complete, chamber 4 is cooled to room temperature at a cooling rate that is desirably between 1.0° C./minute and 0.01° C./minute. The cool-down of the sample(s)/wafer(s) 2 may be interrupted by one or more equilibrium stages where the temperature inside chamber 4 is caused to remain constant for a desired period of time. The sample(s)/wafer(s) 2 are then unloaded from the chamber 4 and fabricated into x-ray and gamma-ray radiation detector devices.

In a deep donor compensation scheme, the point-defect controlled matrix electron $\mu_e \tau_e$ product can be increased in two ways: (1) The shallow donor concentration increases and/or (2) the shallow acceptor concentration decreases. A modification of the deep donor concentration only leads to changes of the resistivity and the hole $\mu_h \tau_h$ product. The reason for is that the concentration of the ionized the deep donors, which determines the electron $\mu_e \tau_e$ product, has to balance the shallow donor—shallow acceptor compensation offset within $<10^{-6}$ ppb to maintain high resistivity at RT (e.g., $>10^9$ Ωcm). Hence, if the shallow level concentrations are constant, possible variations of the ionized deep donor concentrations are orders of magnitude too small to affect the electron $\mu_e \tau_e$ product.

In a deep acceptor compensation scheme, the point-defect controlled matrix electron μτ product can be increased in three ways: (1) The shallow donor concentration increases and/or (2) the shallow acceptor concentration decreases and/or (3) the deep acceptor concentration decreases. The third option is added because in a deep acceptor scheme, the electron μτ product is determined by the concentration of the neutral deep acceptors.

It is believed that the diffusing species ($H_2$; $D_2$; Te; $H_2$ and Te; or $D_2$ and Te) modify one or more of those principal defect concentrations by (a) adding/eliminating defects and/or (b) passivating/de-passivating defects, i.e., making the defects electrically inactive/active (includes possible complex formation/dissolution) and/or (c) modifying deep level capture cross sections for electrons and/or (d) changing defect energy levels by complex formation (shallow-deep or deep-shallow conversion).

In $Cd_{1-x}Zn_xTe$ crystals vastly different shallow donor concentrations (typically but not limited to 200 ppb-3,000 ppb) can lead to almost complete shallow level compensation, i.e., $|N_{AS}-N_{DS}|<0.1$ ppb, where $N_{AS}$ and $N_{DS}$ are the concentrations of shallow acceptors and shallow donors, respectively. This estimate is based on the maximum ionized (deep donor compensation scheme) or neutral (deep acceptor compensation scheme) deep level defect concentration allowed to yield $\mu_e \tau_e > 10^{-3}$ cm$^2$/V. Possible processes involving larger changes of defect concentrations may occur but have to be buffered by a self-driven mechanism (self-compensation). Also, typical SIMS detection limits for $H_2$ and $D_2$ in $Cd_{1-x}Zn_xTe$ crystals are 1500 ppb and 20 ppb, respectively and Te is a matrix component, i.e., actual modifications of defect concentrations in the relevant (sub-ppb) range are not easily mass spectroscopically traceable and the foregoing explanations have to be considered speculative at this point.

One characteristic of the annealing process is that in parallel with the increase of the electron mobility-lifetime product by a factor of 2×-5×, the electrical resistivity of the crystals decreases by the same factor 2×-5×.

Experiments show that the foregoing annealing process produces a desired increase in the electron mobility-lifetime product for a wide range of experimental conditions, such as: annealing temperature(s); Te reservoir temperature(s) (if Te is included in the chamber); and Hydrogen and Deuterium pressures.

The invention has been described with reference to the preferred embodiment(s). Obvious modifications and alterations will occur to those of ordinary skill in the art upon reading and understanding the preceding detailed description. It is intended that the invention be construed as including all such modifications and alterations insofar as they come within the scope of the appended claims or the equivalents thereof.

The invention claimed is:

1. A method of annealing a $Cd_{1-x}Zn_xTe$ sample/wafer comprising:
   (a) exposing the sample/wafer to pressure of $\leq 10^{-5}$ torr of ambient air;
   (b) following step (a), exposing the sample/wafer to $\leq 1.0$ atmosphere of Hydrogen or Deuterium gas and to between $2.1 \times 10^{-7}$ and $3.0 \times 10^{-3}$ atmospheres of Tellurium vapors;
   (c) heating the sample/wafer to a temperature between 400° C.-650° C. and to a temperature greater than a temperature of a source of the Tellurium vapors; and
   (d) maintaining the sample/wafer in the conditions of steps (b) and (c) for a predetermined period of time.

2. The method of claim 1, wherein the source of the Tellurium vapors is heated to a temperature between 250° C.-550° C.

3. The method of claim 1, further including:
   (e) following step (d), cooling the sample/wafer to room temperature at a rate between 0.01° C. per minute and 1.0° C. per minute;
   (f) following step (e), exposing the sample/wafer to ambient air and pressure; and
   (g) fabricating the removed sample/wafer into one or more x-ray and/or gamma-ray radiation detectors.

4. The method of claim 1, further including, prior to step (a), removing surface contamination from the sample/wafer.

5. The method of claim 1, wherein the predetermined period of time is between 1 hour and 128 days.

* * * * *